(12) United States Patent
Mikami et al.

(10) Patent No.: US 8,471,366 B2
(45) Date of Patent: Jun. 25, 2013

(54) NITRIDE SEMICONDUCTOR SUBSTRATE

(75) Inventors: Hidenori Mikami, Itami (JP); Naoki Matsumoto, Itami (JP); Hideki Osada, Itami (JP); Yusuke Yoshizumi, Itami (JP); Sayuri Yamaguchi, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 7 days.

(21) Appl. No.: 13/307,396

(22) Filed: Nov. 30, 2011

(65) Prior Publication Data
US 2013/0134434 A1     May 30, 2013

(51) Int. Cl.
*H01L 29/05*     (2006.01)

(52) U.S. Cl.
USPC ..... 257/615; 257/616; 257/618; 257/E21.214

(58) Field of Classification Search
USPC ............ 257/48, 53, 89, 95–96, 102–103, 257/615–618, 496, 613, E21.214, E21.222; 438/22, 39, 47, 62, 462
See application file for complete search history.

(56) References Cited

U.S. PATENT DOCUMENTS

| | | | |
|---|---|---|---|
| 6,756,246 B2 * | 6/2004 | Hiramatsu et al. | 438/47 |
| 2001/0010372 A1 | 8/2001 | Takeuchi et al. | |
| 2007/0093073 A1 | 4/2007 | Farrell, Jr. et al. | |
| 2007/0221932 A1 * | 9/2007 | Kano et al. | 257/96 |
| 2009/0212277 A1 | 8/2009 | Akita et al. | |
| 2010/0224963 A1 * | 9/2010 | Ishibashi et al. | 257/615 |
| 2011/0068434 A1 * | 3/2011 | Yamaguchi et al. | 257/615 |

FOREIGN PATENT DOCUMENTS

| | | |
|---|---|---|
| JP | 11-112029 | 4/1999 |
| JP | 2001-230497 | 8/2001 |
| JP | 2002-356398 | 12/2002 |
| JP | 2008-42157 | 2/2008 |
| JP | 2008-060375 | 3/2008 |
| JP | 2008-543089 | 11/2008 |
| JP | 2009-200337 | 9/2009 |
| JP | 2009-218284 A | 9/2009 |
| JP | 4333820 B | 9/2009 |

OTHER PUBLICATIONS

Yohei Enya et al., "531 nm Green Lasing of InGaN Based Laser Diodes on Semi-Polar {2021} Free-Standing GaN Substrates," Applied Physics Express 2 (2009), pp. 082101-1-082101-3.
Article of Nikkan Kogyo Shimbun, Aug. 20, 2009 with Partial English Translation.
Yusuke Yoshimizu et al., "Continuous-Wave Operation of 520 nm Green InGaN-Based Laser Diodes on Semi-Polar {2021} GaN Substrates," Applied Physics Express 2 (2009), pp. 092101-1-092101-3.
Article of Nikkei Electronics, Aug. 24, 2009 with Partial English Translation.

* cited by examiner

*Primary Examiner* — Dung A. Le
(74) *Attorney, Agent, or Firm* — Drinker Biddle & Reath LLP

(57) ABSTRACT

A nitride semiconductor device includes a main surface and an indicator portion. The main surface is a plane inclined by at least 71° and at most 79° in a [1-100] direction from a (0001) plane or a plane inclined by at least 71° and at most 79° in a [-1100] direction from a (000-1) plane. The indicator portion indicates a (-1017) plane, a (10-1-7) plane, or a plane inclined by at least −4° and at most 4° in the [1-100] direction from these planes and inclined by at least −0.5° and at most 0.5° in a direction orthogonal to the [1-100] direction.

4 Claims, 8 Drawing Sheets

INCLINATION ANGLE (°) OF MAIN SURFACE OF GaN SUBSTRATE

SURFACE ACCURACY (°)

NITRIDE SEMICONDUCTOR SUBSTRATE

BACKGROUND OF THE INVENTION

1. Field of the Invention

The present invention relates to a nitride semiconductor substrate and, more specifically, to a gallium nitride (GaN) substrate.

2. Description of the Background Art

Nitride semiconductor substrates such as GaN substrates having energy band-gap of 3.4 eV and high thermal conductivity are attracting attention as material for semiconductor devices including short-wavelength optical devices and power electronic devices. A GaN substrate as an example of such nitride semiconductor substrates has an orientation flat (hereinafter also denoted as OF) or a notch formed at a part of outer circumference, to facilitate positioning or determination of crystal orientation (see, for example, Japanese Patent Laying-Open Nos. 2008-42157 and 2002-356398).

According to the documents mentioned above, an OF or a notch is formed in a GaN substrate having a (0001) plane as a main surface. A method of forming an OF or a notch in a nitride semiconductor substrate having a main surface inclined from the (0001) plane, however, has not been known. Without forming an OF or a notch, it is difficult to know the plane direction or polar face and, therefore, it may be possible that semiconductor devices are formed in an unintended direction. Therefore, it has been difficult to form semiconductor devices using a nitride semiconductor substrate having a main surface inclined from the (0001) plane.

SUMMARY OF THE INVENTION

Therefore, an object of the present invention is to provide a nitride semiconductor substrate that can be used for semiconductor devices.

The inventors have found that a nitride semiconductor substrate that can improve lasing yield when semiconductor lasers are fabricated therefrom has a main surface inclined by at least 71° and at most 79° in the [1-100] direction from the (0001) plane or a main surface inclined by at least 71° and at most 79° in the [−1100] direction from the (000-1) plane. As a result of intensive study to identify plane orientation in order to use the nitride semiconductor substrate having such a main surface for semiconductor devices, it has been found that cleavage readily occurs at or near a (−1017) plane or a (10-1-7) plane.

In view of the foregoing, the present invention provides a nitride semiconductor substrate, including a main surface and an indicator portion. The main surface is a plane inclined by at least 71° and at most 79° in a [1-100] direction from a (0001) plane, or a plane inclined by at least 71° and at most 79° in a [−1100] direction from a (000-1) plane. The indicator portion indicates a (−1017) plane, a (10-1-7) plane, or a plane inclined by at least −4° and at most 4° in [1-100] direction from these planes and inclined by at least −0.5° and at most 0.5° in a direction orthogonal to the [1-100] direction.

The nitride semiconductor substrate in accordance with the present invention has a main surface that can improve production yield when semiconductor devices are formed. The inventors have made it clear for the first time that, in the nitride semiconductor substrate having such a main surface, the indicator portion can identify a (−1017) plane, a (10-1-7) plane, a plane inclined by at least −4° and at most 4° in [1-100] direction from these planes and inclined by at least −0.5° and at most 0.5° in a direction orthogonal to the [1-100] direction. Because of this indicator portion, it becomes possible to identify a plane that is easy to cleave, when semiconductor devices are to be fabricated using the nitride semiconductor substrate having the main surface. As a result, positioning or determination of crystal orientation using the easy-to-cleave plane becomes possible. Thus, semiconductor devices with improved characteristics can be fabricated using the nitride semiconductor substrate in accordance with the present invention. Thus, the nitride semiconductor substrate of the present invention can be used for semiconductor devices.

Preferably, in the nitride semiconductor substrate described above, the indicator portion is an orientation flat, and the orientation flat is the (−1017) plane, the (10-1-7) plane, or a plane inclined by at least −4° and at most 4° in the [1-100] direction from these planes and inclined by at least −0.5° and at most 0.5° in a direction orthogonal to the [1-100] direction.

The (−1017) plane, the (10-1-7) plane, or the plane inclined by at least −4° and at most 4° in the [1-100] direction from these planes and inclined by at least −0.5° and at most 0.5° in the direction orthogonal to the [1-100] direction has a characteristic that tends to be cleaved easily and, therefore, the orientation flat can be formed easily.

Preferably, the nitride semiconductor substrate described above further includes a second orientation flat as a (11-20) plane, or a plane inclined by at least −4° and at most 4° in the [1-100] direction from this plane and inclined by at least −0.5° and at most 0.5° in a direction orthogonal to the [1-100] direction.

The (11-20) plane, or the plane inclined by at least −4° and at most 4° in the [1-100] direction from this plane and inclined by at least −0.5° and at most 0.5° in a direction orthogonal to the [1-100] direction has a characteristic that tends to be cleaved easily and, therefore, the second OF can be formed easily and, as a result, it becomes possible to determine the front and back sides of the nitride semiconductor substrate.

Preferably, in the nitride semiconductor substrate described above, the main surface is a (20-21) plane or a (−202-1) plane, and the indicator portion indicates the (−1017) plane or the (10-1-7) plane.

The (20-21) plane or the (−202-1) plane particularly contributes to improvement of characteristics when semiconductor devices are fabricated. Further, the (−1017) plane or the (10-1-7) plane is orthogonal to the (20-21) plane or the (−202-1) plane, respectively, and has a characteristic that tends to be cleaved easily. Therefore, semiconductor devices with further improved characteristics can be fabricated.

As described above, the nitride semiconductor substrate can be used for semiconductor devices.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
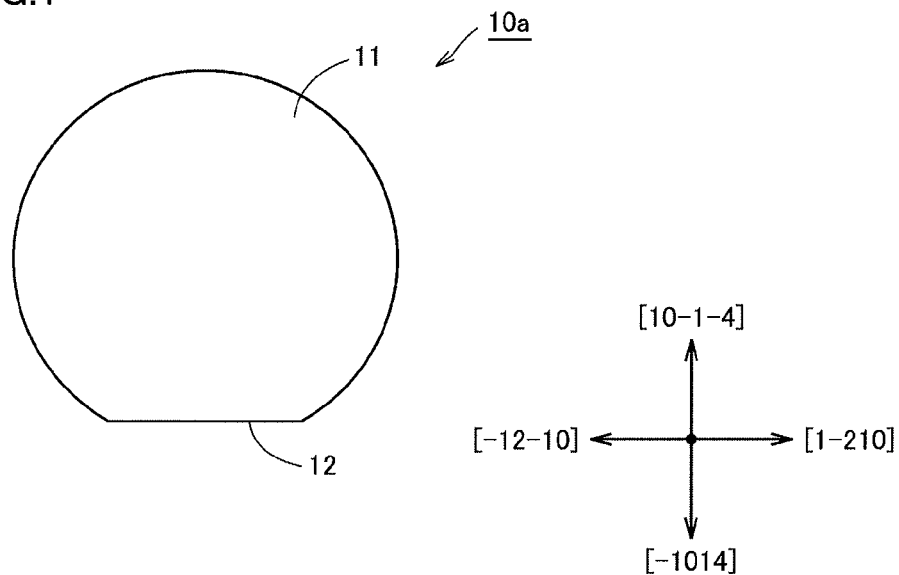
FIG. 1 is a plan view schematically showing the nitride semiconductor substrate in accordance with Embodiment 1 of the present invention.

In the following, embodiments of the present invention will be described with reference to the figures. In the figures, the same or corresponding portions are denoted by the same reference characters and description thereof will not be repeated. Further, in the specification, individual orientation is indicated in square brackets [ ] and individual plane is indicated in parentheses ( ). The individual orientation and individual plane include equivalent orientation and equivalent plane, respectively. Further, in crystallography, a negative index is generally represented by a bar "_" over a numeral. In the present specification, however, a negative sign is added before the numeral.

Embodiment 1

Figure 2:
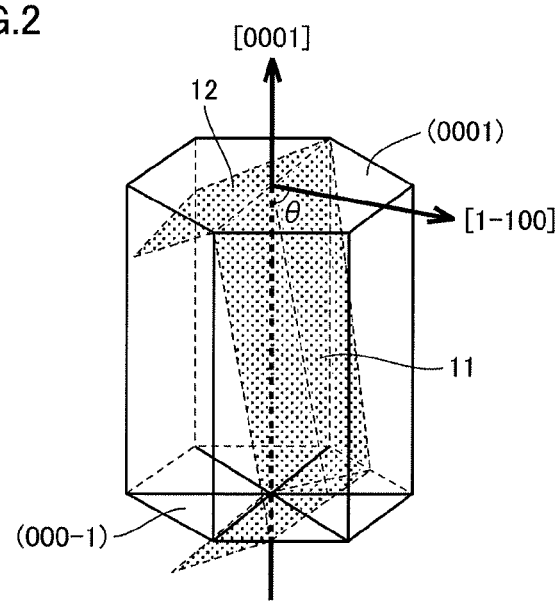
FIG. 2 schematically shows the crystal orientations of the main surface and the orientation flat of the nitride semiconductor substrate in accordance with Embodiment 1 of the present invention.

Referring to FIGS. 1 and 2, a nitride semiconductor substrate 10a in accordance with the present embodiment will be described. As shown in FIG. 1, nitride semiconductor substrate 10a in accordance with the present embodiment includes a main surface 11 and an orientation flat 12 as the indicator portion.

Two-dimensional shape of main surface 11 is, for example, circular. Main surface 11 is a plane inclined by at least 71° and at most 79° in the [1-100] direction from the (0001) plane, or a plane inclined by at least 71° and at most 79° in the [-1100] direction from the (000-1) plane. The plane inclined by at least 71° and at most 79° in the [1-100] direction from the (0001) plane is a plane inclined by at least -4° and at most 4° from the (20-21) plane. This plane is a Ga-rich plane where Ga atoms are much exposed. The plane inclined by at least 71° and at most 79° in the [-1100] direction from the (000-1) plane is a plane inclined by at least -4° and at most 4° from the (-202-1) plane. This plane is an N-rich plane where N atoms are much exposed. Specifically, main surface 11 is the (20-21) plane, (-202-1) plane or a plane inclined by at least -4° and at most 4° from these planes.

Main surface 11 is preferably a plane inclined by at least 73° and at most 77° in the [1-100] direction from the (0001) plane, or a plane inclined by at least 73° and at most 77° in the [-1100] direction from the (000-1) plane. Specifically, it is preferably the (20-21) plane, (-202-1) plane or a plane inclined by at least -2° and at most 2° from these planes. More preferably, main surface 11 is a plane inclined by 75° in the [1-100] direction from the (0001) plane, or a plane inclined by 75° in the [-1100] direction from the (000-1) plane. Specifically, it is preferably the (20-21) plane or the (-202-1) plane.

Main surface 11 may be inclined in a direction orthogonal to the [1-100] direction or the [-1100] direction. In such a case, the angle of inclination is at least -0.5° and at most 0.5° in the direction orthogonal to the [1-100] direction or the direction orthogonal to the [-1100] direction.

Here, the plane orientation of a plane inclined by at least 71° and at most 79° in the [1-100] direction from the (0001) plane forming the main surface 11 will be described with reference to FIG. 2. As shown in FIG. 2, main surface 11 is a plane inclined by an angle θ in the [1-100] direction from the (0001) plane. In other words, main surface 11 is a plane inclined by an angle θ in the [1-100] direction from the direction. The angle is at least 71° and at most 79°, preferably at least 73° and at most 77°, and more preferably is or close to 75°. The (20-21) plane is a plane inclined by about 75° (=angle θ) in the [1-100] direction from the (0001) plane. The (0001) plane is where Ga atoms are exposed.

The same applies to the plane inclined by at least 71° and at most 79° in the [-1100] direction from the (000-1) plane forming the main surface 11 and, therefore, description using a drawing will not be given here. The (-202-1) plane is the plane inclined by about 75° in the [-1100] direction from the (000-1) plane. The (000-1) plane is where N atoms are exposed.

If the angle of inclination is at least 71° and at most 79°, the production yield of semiconductor devices (for example, semiconductor lasers) fabricated using nitride semiconductor substrate 10a can be improved (for example, 50% or more). If the angle of inclination is at least 73° and at most 77°, the production yield of semiconductor devices (for example, semiconductor lasers) fabricated using nitride semiconductor substrate 10a can further be improved (for example, 75% or more). If the angle of inclination is or close to 75°, the production yield of semiconductor devices (for example, semiconductor lasers) fabricated using nitride semiconductor substrate 10a can further be improved (for example, 85% or more).

Orientation flat 12 is a portion formed by cutting flat an arch of outer circumference, for indicating crystal orientation of nitride semiconductor substrate 10a. In other words, orientation flat 12 is a flat portion formed at a part of the circle when main surface 11 is viewed from above. Orientation flat 12 is substantially orthogonal to main surface 11. Further, orientation flat 12 is the (-1017) plane, the (10-1-7) plane or a plane inclined by at least -4° and at most 4° in the [1-100] direction from these planes and inclined by at least -0.5° and at most 0.5° in a direction orthogonal to the [1-100] direction.

The plane orientation of orientation flat 12 will be described with reference to FIG. 2. As shown in FIG. 2, orientation flat 12 is or close to the (-1017) plane or the (10-1-7) plane. The (-1017) plane or the (10-1-7) plane is substantially orthogonal (90, 10° to the (20-21) plane or the (−202-1) plane. Therefore, orientation flat 12 is substantially orthogonal to main surface 11. The (−1017) plane or the (10-1-7) plane is different from the conventional cleavage plane such as the c-plane ((a plane equivalent to the (0001) plane), m-plane (a plane equivalent to the (1-100) plane) or the a-plane (a plane equivalent to the (11-20) plane).

The direction of (−1017) plane or the (10-1-7) plane is the [−1014] direction or the [10-1-4] direction.

As a result of intensive study, the inventors have found that the (−1017) plane, the (10-1-7) plane or a plane inclined by at least −4° and at most 4° in the [1-100] direction from these planes and inclined by at least −0.5° and at most 0.5° in a direction orthogonal to the [1-100] direction has a characteristic that tends to be cleaved easily. Further, the inventors also found that production yield can be improved (for example, 50% or more) when semiconductor devices (for example, semiconductor lasers) are formed using nitride semiconductor substrate 10a having the (−1017) plane, the (10-1-7) plane or a plane inclined by at least −4° and at most 4° in the [1-100] direction from these planes and inclined by at least −0.5° and at most 0.5° in a direction orthogonal to the [1-100] direction as orientation flat 12.

The angle of inclination of orientation flat 12 in the [1-100] direction with respect to the (−1017) plane or the (10-1-7) plane is preferably at least −4° and at most 4°, more preferably at least −2° and at most 2°, and further preferably, is or close to 0°. If the angle is at least −4° and at most 4°, the production yield of semiconductor devices (for example, semiconductor lasers) fabricated using nitride semiconductor substrate 10a can be improved (for example, 50% or more). If the angle is at least −2° and at most 2°, the production yield of semiconductor devices fabricated using nitride semiconductor substrate 10a can further be improved (for example, 75% or more). If the angle is or close to 0', the production yield of semiconductor devices fabricated using nitride semiconductor substrate 10a can further be improved (for example, 85% or more).

The angle of inclination of orientation flat in the direction orthogonal to the [1-100] direction with respect to the (−1017) plane or the (10-1-7) plane is preferably at least −0.5° and at most 0.5°, more preferably at least −0.2° and at most 0.2°, and further preferably, is or close to 0°. If the angle is at least −0.5° and at most 0.5°, the production yield of semiconductor devices (for example, semiconductor lasers) fabricated using nitride semiconductor substrate 10a can be improved (for example, 50% or more). If the angle is at least −0.2° and at most 0.2°, the production yield of semiconductor devices fabricated using nitride semiconductor substrate 10a can further be improved (for example, 75% or more). If the angle is or close to 0°, the production yield of semiconductor devices fabricated using nitride semiconductor substrate 10a can further be improved (for example, 80% or more).

Orientation flat 12 may be: inclined in the [1-100] direction and inclined in the direction orthogonal to the [1-100] direction; inclined in the [1-100] direction and not inclined in the direction orthogonal to the [1-100] direction; not inclined in the [1-100] direction and inclined in the direction orthogonal to the [1-100] direction; or not inclined in the [1-100] direction and not inclined in the direction orthogonal to the [1-100] direction.

The (−1017) plane or the (10-1-7) plane of orientation flat 12 is orthogonal to the (20-21) plane or the (−202-1) plane of main surface 11. In other words, the (20-21) plane is orthogonal to the (−1017) plane and the (10-1-7) plane. The (−202-1) plane is orthogonal to the (−1017) plane and the (10-1-7) plane. This structure is the most preferable for nitride semiconductor substrate 10a. When main surface 11 is inclined by at least −4° and at most 4° in the [1-100] direction from the (20-21) plane or from the (−202-1) plane and when orientation flat 12 is inclined by at least −4° and at most 4° in the [1-100] direction from the (−1017) plane or the (10-1-7) plane, similar light confinement effect can be attained. On the other hand, the light confinement effect differs when orientation flat 12 is inclined in the direction orthogonal to the [1-100] direction from the (−1017) plane or the (10-1-7) plane. Therefore, the tolerable range of inclination angle in the [1-100] direction and the tolerable range of inclination angle in the direction orthogonal to the [1-100] direction are different as conditions required for ensuring high production yield.

The nitride semiconductor substrate 10a is, by way of example, of $Al_xIn_yGa_{(1-x-y)}N$ ($0 \leq x \leq 1$, $0 \leq y \leq 1$, $x+y \leq 1$), preferably of $Al_xGa_{(1-x)}N$ ($0 \leq x \leq 1$) and more preferably, GaN.

As to the size of nitride semiconductor substrate 10a, if it is circular, the diameter is preferably at least 10 mm, more preferably at least 30 mm, further preferably at least 2 inches and most preferably at least 3 inches. If nitride semiconductor substrate 10a is rectangular, the size is preferably at least 10 mm×10 mm, more preferably at least 18 mm×18 mm, and more preferably, 30 mm×30 mm. With the size of nitride semiconductor substrate being in the range as described above, good productivity can be attained. Preferably, nitride semiconductor substrate 10a has a thickness of at least 100 μm and at most 1000 μm. Thickness of 100 μm or more ensures easy handling, and thickness of 1000 μm or less allows easy splitting. More preferably, the thickness is at least 300 μm and at most 400 μm.

Next, the method of manufacturing nitride semiconductor substrate 10a in accordance with the present embodiment will be described.

First, a base substrate is prepared. The base substrate to be prepared may be of the same material as or different from the material of nitride semiconductor substrate 10a to be grown. By way of example, a GaN substrate, a gallium arsenide (GaAs) substrate, a sapphire ($Al_2O_3$) substrate, a zinc oxide (ZnO) substrate, a carbon silicate (SiC) substrate or the like may be used as the base substrate.

Next, on the base substrate, a nitride semiconductor crystal is grown. The method of growing nitride semiconductor crystal is not specifically limited, and sublimation, vapor phase growth such as HVPE (Hydride Vapor Phase Epitaxy), MOCVD (Metal Organic Chemical Vapor Deposition) or MBE (Molecular Beam Epitaxy), or liquid phase growth such as flux method or ammonothermal method may be used.

Next, from the grown nitride semiconductor crystal, a nitride semiconductor substrate is cut out. Here, the substrate is cut out such that the main surface is inclined by at least 71° and at most 79° in the [1-100] direction from the (0001) plane, or inclined by at least 71° and at most 79° in the [−1100] direction from the (000-1) plane. By way of example, if the main surface of base substrate is the (0001) plane, the nitride semiconductor crystal grows in the [0001] direction. Therefore, the nitride semiconductor substrate is cut, for example, along the plane parallel to the main surface of FIG. 2 (the plane inclined by an angle θ in the direction [1-100] from the (0001) plane).

The method of cutting-out is not specifically limited, and mechanical method of taking out such as slicing may be used. Slicing refers to cutting out of nitride semiconductor substrate 10a mechanically from the nitride semiconductor crystal using a slicer having an outer circumferential blade, a slicer having an inner circumferential blade or a wire saw.

The base substrate may be removed as needed. The method of removing the base substrate is not specifically limited and, by way of example, cutting or grinding may be used. Here, cutting refers to mechanically dividing (slicing) an interface between the nitride semiconductor crystal and the base substrate using a slicer with an outer circumferential blade of an electrodeposited diamond wheel or a wire saw, to irradiate with laser pulse or jet-spraying water at the interface between the nitride semiconductor crystal and the base substrate, to cleave along a crystal lattice plane, or to conduct a chemical method such as etching, so as to divide the nitride semiconductor crystal from the base substrate. Grinding refers to bringing a rotating grinder into contact with the surface to scrape off in the thickness direction. As an example of the method of removing the base substrate by grinding, the base substrate is mechanically scraped off by a grinding device with a diamond grinder.

Fabrication of nitride semiconductor substrate 10a having the main surface inclined by at least 71° and at most 79° in the [1-100] direction from the (0001) plane, or inclined by at least 71° and at most 79° in the [-1100] direction from the (000-1) plane is not limited to cutting out the nitride semiconductor substrate at a desired angle from the nitride semiconductor crystal grown in the c-axis direction. For instance, it is possible to manufacture a nitride semiconductor substrate by further growing a nitride semiconductor crystal on the main surface of the nitride semiconductor substrate obtained in the above-described manner, producing nitride semiconductor substrate by cutting-out the grown semiconductor crystal at a plane parallel to the main surface of the crystal substrate, and by processing the main surface of the resulting nitride semiconductor substrate. The nitride semiconductor substrate used as the base substrate for the further growth (repetitive growth) of the nitride semiconductor crystal described above is not necessarily one substrate, and a plurality of small-sized crystal substrates may be used. At the time of repetitive growth, the substrates may be joined to be a single crystal. Further, it is also possible to use the crystal substrate cut out from the nitride semiconductor crystal joined by the repetitive growth, for the next repetitive growth. Thus, by using and repetitively growing the nitride semiconductor crystals, the cost can be reduced.

Next, outer shape of the nitride semiconductor substrate is processed. Specifically, the outer shape is processed such that the two-dimensional shape becomes circular. The method of processing the outer shape is not specifically limited, and cutting or grinding may be used.

Next, orientation flat 12 is formed. Orientation flat 12 is a (-1017) plane, a (10-1-7) plane, or a plane inclined by at least -4° and at most 4° in [1-100] direction from these planes and inclined by at least -0.5° and at most 0.5° in a direction orthogonal to the [1-100] direction. Though the method of forming orientation flat 12 is not specifically limited, cutting, grinding or the like is conducted to expose the (-1017) plane, the (10-1-7) plane, or the plane inclined by at least -4° and at most 4° in [1-100] direction from these planes and inclined by at least -0.5° and at most 0.5° in a direction orthogonal to the [1-100] direction.

Next, at least one of polishing and grinding is conducted on the main surface of nitride semiconductor substrate 10a. At least one of polishing and grinding may be conducted further on the back surface of nitride semiconductor substrate 10a.

Surface roughness of the main surface of nitride semiconductor substrate 10a should preferably be at most 10 nm by Ra standard. Surface roughness of the back surface of nitride semiconductor substrate 10a should preferably be at most 10 µm by Ra standard. Ra represents, for example, the value of surface roughness measured in accordance with JIS (Japanese Industrial Standard) B0601.

By the process steps described above, nitride semiconductor substrate 10a shown in FIG. 1 can be manufactured. The order of process steps is not specifically limiting and, for example, nitride semiconductor substrate 10a may be sliced after orientation flat 12 is formed on the ingot.

The method of manufacturing nitride semiconductor substrate 10a is not limited to the one described above, and it may be manufactured by a different method.

As described above, nitride semiconductor substrate 10a in accordance with the present embodiment has a main surface inclined by at least 71° and at most 79° in the [1-100] direction from the (0001) plane or inclined by at least 71° and at most 79° in the [-1100] direction from the (000-1) plane, and orientation flat 12 as an indicator portion indicating the (-1017) plane, the (10-1-7) plane or a plane inclined by at least -4° and at most 4° in the [1-100] direction from these planes and inclined by at least -0.5° and at most 0.5° in a direction orthogonal to the [1-100] direction.

Through intensive study, the inventors have found that the nitride semiconductor substrate that can improve lasing yield when semiconductor lasers are fabricated therefrom has a main surface inclined by at least 71° and at most 79° in the [1-100] direction from the (0001) plane or a plane inclined by at least 71° and at most 79° in the [-1100] direction from the (000-1) plane. As a result of intensive study to identify plane orientation in order to use the nitride semiconductor substrate having such a surface for semiconductor devices, it has been found that cleavage readily occurs at or near the (-1017) plane or the (10-1-7) plane. Then, the inventors have made it clear for the first time that, in the nitride semiconductor substrate 10a having the main surface 11 inclined by at least 71° and at most 79° in the [1-100] direction from the (0001) plane or the main surface 11 inclined by at least 71° and at most 79° in the [-1100] direction from the (000-1) plane, an indicator portion can identify a (-1017) plane, a (10-1-7) plane, or a plane inclined by at least -4° and at most 4° in [1-100] direction from these planes and inclined by at least -0.5° and at most 0.5° in a direction orthogonal to the [1-100] direction. Further, the (-1017) plane, the (10-1-7) plane, and the plane inclined by at least -4° and at most 4° in [1-100] direction from these planes and inclined by at least -0.5° and at most 0.5° in a direction orthogonal to the [1-100] direction are new planes not conventionally utilized. From the foregoing, when semiconductor devices are to be fabricated using nitride semiconductor substrate 10a having such a main surface 11, a plane that is easy to cleave can be identified by orientation flat 12. Therefore, the crystal orientation can be positioned or determined using the plane that is easy to cleave. By way of example, when semiconductor lasers are fabricated using nitride semiconductor substrate 10a, patterning accuracy of the semiconductor lasers depends on the alignment with reference to orientation flat 12 or the like. Therefore, accuracy of orientation flat has an influence on the patterning accuracy. By improving the accuracy of orientation flat, production yield of semiconductor lasers can be improved. Therefore, by using nitride semiconductor substrate 10a in accordance with the present embodiment, it becomes possible to fabricate semiconductor devices with improved characteristics. The nitride semiconductor substrate 10a in accordance with the present invention can be used for semiconductor devices.

Embodiment 2

Figure 3:
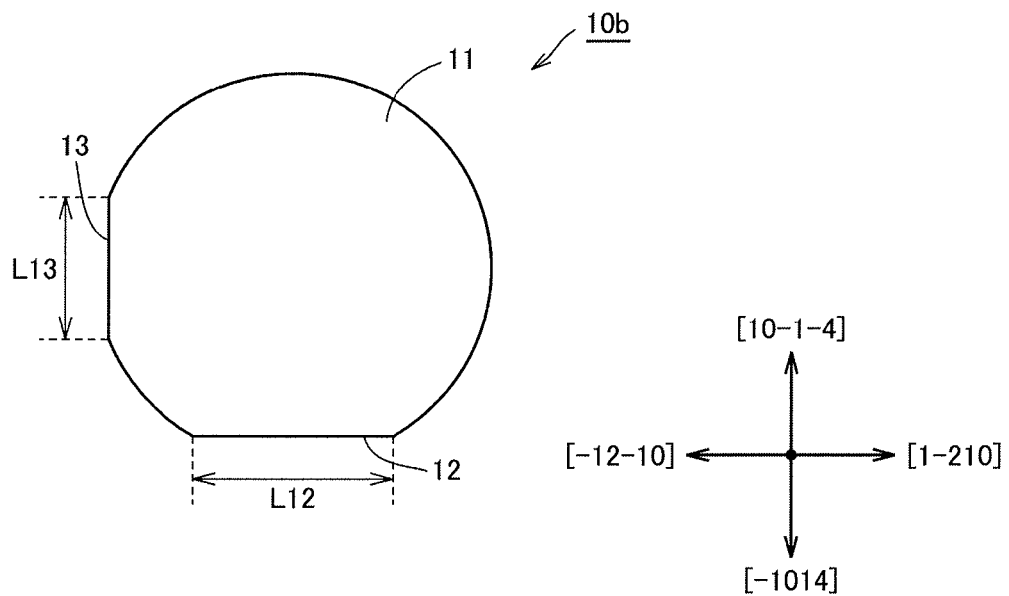
FIG. 3 is a plan view schematically showing the nitride semiconductor substrate in accordance with Embodiment 2 of the present invention.

Referring to FIG. 3, a nitride semiconductor substrate 10b in accordance with the present embodiment will be described.

Nitride semiconductor substrate 10b in accordance with the present embodiment basically has the same structure as nitride semiconductor substrate 10a in accordance with Embodiment 1, and it is different in that it is additionally provided with a second orientation flat 13.

The second orientation flat 13 is an IF (Identification Flat) or a sub-orientation flat for indicating two things, that is, orientation and front/back surfaces. The second orientation flat 13 is substantially orthogonal to orientation flat 12. The second orientation flat 13 is a (11-20) plane, or a plane inclined by at least −4° and at most 4° in the [1-100] direction from this plane, and inclined by at least −0.5° and at most 0.5° in the direction orthogonal to the [1-100] direction. More preferably, the second orientation flat 13 is the (11-20) plane.

Figure 4:
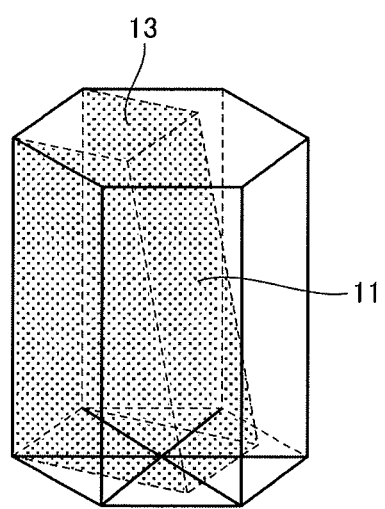
FIG. 4 schematically shows the crystal orientations of the main surface and the second orientation flat of the nitride semiconductor substrate in accordance with Embodiment 2 of the present invention.

Here, the plane orientation of the second orientation flat 13 will be described with reference to FIG. 4. As shown in FIG. 4, the second orientation flat 13 is near the (11-20) plane. The (11-20) plane is substantially orthogonal to the (20-21) plane or the (−202-1) plane, and also substantially orthogonal to the (−1017) plane or the (10-1-7) plane.

By the second orientation flat 13, the (11-20) plane, or the plane inclined by at least −4° and at most 4° in the [1-100] direction from this plane, and inclined by at least −0.5° and at most 0.5° in the direction orthogonal to the [1-100] direction can be identified. Further, cleavage readily occurs at or near the (11-20) plane and, therefore, the second orientation flat 13 can be formed easily. If the second orientation flat 13 is near the (11-20) plane, production yield of semiconductor devices can further be improved.

In FIG. 3, the [1-210] direction and the [−12-10] direction represent the plane orientations of planes equivalent to the (11-20) plane.

The length L12 of orientation flat 12 is preferably different from the length L13 of the second orientation flat 13, and more preferably, sufficiently different to allow distinction between the two when viewed. Examples of the size of orientation flat 12 and the second orientation flat 13 are as follows. Assuming that the diameter of main surface 11 of nitride semiconductor substrate 11b is 50 mm, the length L2 of orientation flat 12 is at least 2 mm and at most 30 mm, and the length L13 of the second orientation flat 13 is shorter than L12 and at least 2 mm and at most 20 mm.

Either one of the length L12 of orientation flat 12 or the length L13 of the second orientation flat 13 may be longer than the other.

Here, the length L12 of orientation flat 12 or the length L13 of the second orientation flat 13 represents the length of a straight line when nitride semiconductor substrate 10b is viewed from above.

The method of manufacturing the nitride semiconductor substrate in accordance with the present embodiment is basically the same as the method of manufacturing the nitride semiconductor substrate in accordance with Embodiment 1, and it is different in that it further includes the step of forming the second orientation flat 13. Specifically, before, after or simultaneously with the formation of orientation flat 12, the second orientation flat 13 as the (11-20) plane or a plane inclined by at least −4° and at most 4° in the [1-100] direction from this plane and inclined by at least −0.5° and at most 0.5° in the direction orthogonal to the [1-100] direction is formed.

As described above, nitride semiconductor substrate 10b in accordance with the present embodiment additionally includes the second orientation flat 13 as the (11-20) plane or the plane inclined by at least −4° and at most 4° in the [1-100] direction from this plane and inclined by at least −0.5° and at most 0.5° in the direction orthogonal to the [1-100] direction.

The (11-20) plane or the plane inclined by at least −4° and at most 4° in the [1-100] direction from this plane and inclined by at least −0.5° and at most 0.5° in the direction orthogonal to the [1-100] direction has a characteristic that tends to be easily cleaved and, therefore, the second orientation flat 13 can easily be formed. Further, it becomes possible to determine the front side and the back side of nitride semiconductor substrate 10b.

Embodiment 3

Figure 5:
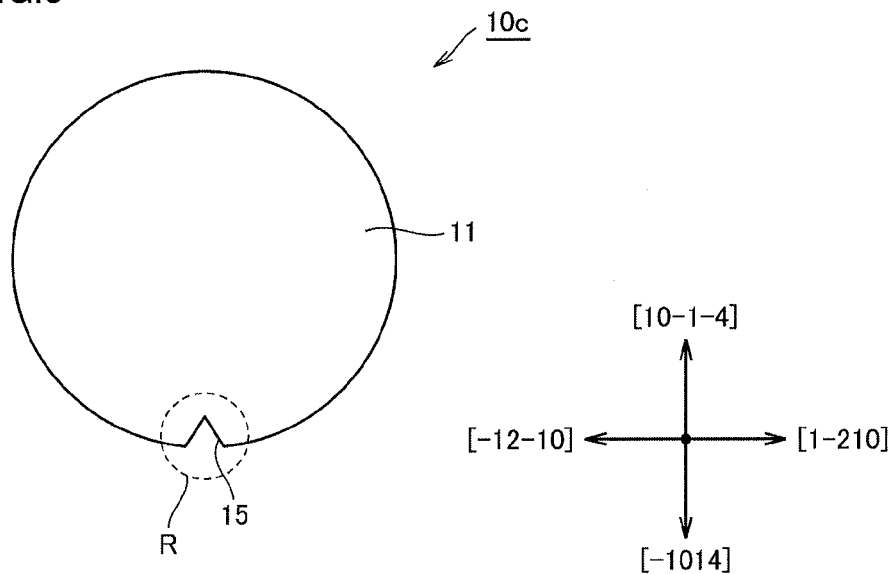
FIG. 5 is a plan view schematically showing the nitride semiconductor substrate in accordance with Embodiment 3 of the present invention.
Figure 6:
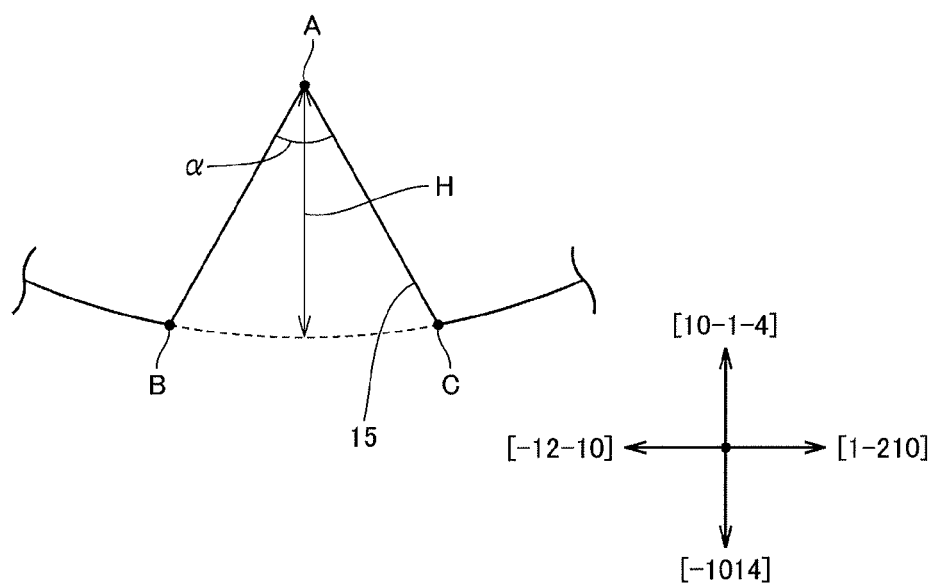
FIG. 6 is an enlarged plan view of an area R of FIG. 5.

Referring to FIGS. 5 and 6, a nitride semiconductor substrate 10c in accordance with the present embodiment will be described. Nitride semiconductor substrate 10c in accordance with the present embodiment basically has the same structure as nitride semiconductor substrate 10a in accordance with Embodiment 1, and it is different in that it includes a notch 15 as an indicator portion.

Notch 15 is a hollow cut-out formed in the outer circumference of nitride semiconductor substrate 10c. As shown in FIGS. 5 and 6, notch 15 is formed to identify the (−1017) plane, (10-1-7) plane or the plane inclined by at least −4° and at most 4° in [1-100] direction from these planes and inclined by at least −0.5° and at most 0.5° in a direction orthogonal to the [1-100] direction. Specifically, as shown in FIG. 6, when three points A, B and C are positioned at notch 15, the direction from the center between B and C to the point A is the [−1014] direction or the [10-1-4] direction.

As shown in FIG. 6, the depth H of notch 15 is, for example, at least 2 mm and at most 10 mm, and the angle α is, for example, at least 30° and at most 120°. If the depth H is at most 10 mm and the angle α is at most 120°, the area of main surface 11 is not much narrowed, and if the depth H is at least 2 mm and the angle is at least 30°, notch 15 can readily be identified.

The method of manufacturing the nitride semiconductor substrate 10c in accordance with the present embodiment is basically the same as the method of manufacturing the nitride semiconductor substrate in accordance with Embodiment 1, and it is different in that notch 15 is formed in place of orientation flat 12. The method of forming notch 15 is not specifically limited, and it may be formed by cutting, grinding or polishing.

Embodiment 4

Figure 7:
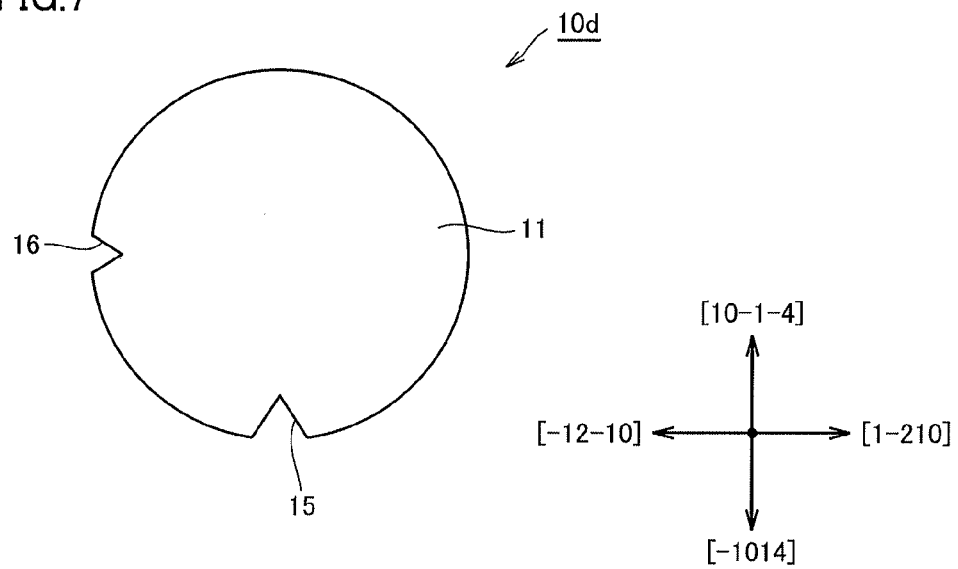
FIG. 7 is a plan view schematically showing the nitride semiconductor substrate in accordance with Embodiment 4 of the present invention.

Referring to FIG. 7, a nitride semiconductor substrate 10d in accordance with the present embodiment will be described. Nitride semiconductor substrate 10d in accordance with the present embodiment basically has the same structure as nitride semiconductor substrate 10c in accordance with Embodiment 3, and it is different in that it is additionally provided with a second notch 16. Further, nitride semiconductor substrate 10d in accordance with the present embodiment basically has the same structure as nitride semiconductor substrate 10b in accordance with Embodiment 2, and it is different in that it includes notch 15 and the second notch 16 in place of orientation flat 15 and the second orientation flat 16.

The second notch 16 is provided to indicate two things, that is, orientation and front/back surfaces. The direction of the second notch 16 is substantially orthogonal to the direction of notch 15. The second notch 16 indicates the (11-20) plane, or a plane inclined by at least −4° and at most 4° in the [1-100] direction from this plane, and inclined by at least −0.5° and at most 0.5° in the direction orthogonal to the [1-100] direction, and more preferably, it indicates the (11-20) plane.

It is preferred that notch 15 can be distinguished from the second notch 16, so that notch 15 can be recognized as the main notch and the second notch 16 as the sub-notch. For distinction, by way of example, notch 15 is made larger than the second notch 16. The method of manufacturing the nitride semiconductor substrate 10d in accordance with the present embodiment is basically the same as the method of manufacturing the nitride semiconductor substrate 10c in accordance with Embodiment 3, and it is different in that the second notch 16 is additionally formed.

Embodiment 5

Figure 8:
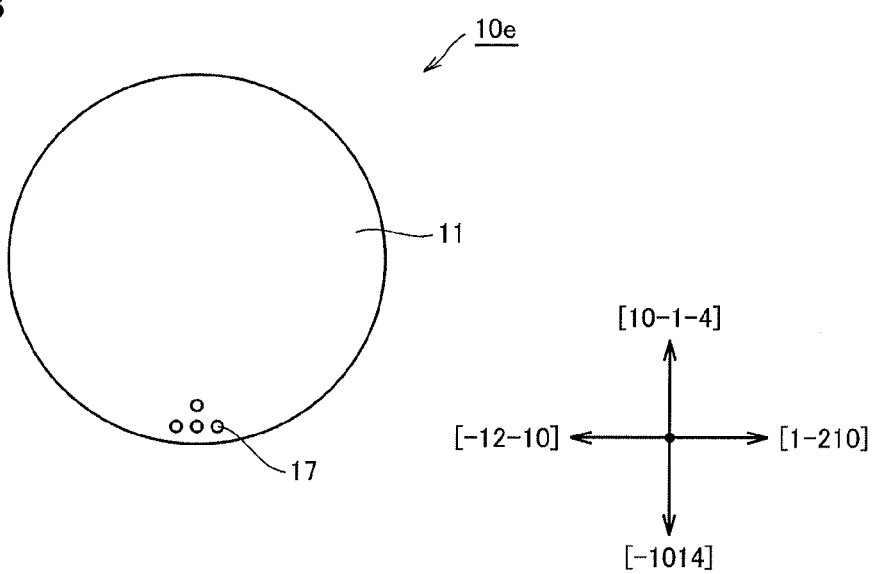
FIG. 8 is a plan view schematically showing the nitride semiconductor substrate in accordance with Embodiment 5 of the present invention.

Referring to FIG. 8, a nitride semiconductor substrate 10e in accordance with the present embodiment will be described. Nitride semiconductor substrate 10e in accordance with the present embodiment basically has the same structure as nitride semiconductor substrate 10a in accordance with Embodiment 1, and it is different in that a mark 17 is formed as the indicator portion.

Mark 17 is, for example, a laser irradiation spot or a trace scribed by a diamond pen. Mark 17 is formed to identify the (−1017) plane, the (10-1-7) plane, or the plane inclined by at least −4° and at most 4° in the [1-100] direction from these planes and inclined by at least −0.5° and at most 0.5° in a direction orthogonal to the [1-100] direction. By way of example, a plurality of marks 17 are formed in a direction parallel to the [10-1-4] direction, the [−1014] direction or the direction inclined by at least −4° and at most 4° in the [1-100] direction from these directions and inclined by at least −0.5° and at most 0.5° in a direction orthogonal to the [1-100] direction.

Further, it is preferred that mark or marks 17 are formed to allow identification of the (11-20) plane, or the plane inclined by at least −4° and at most 4° in the [1-100] direction from this plane and inclined by at least −0.5° and at most 0.5° in a direction orthogonal to the [1-100] direction. For instance, marks 17 are formed in such a size and number that are different in the [10-1-4] direction or the [−1014] direction and in the [1-210] direction or the [−12-10] direction. In the present embodiment, the number of marks 17 is made larger in the [10-1-4] direction than in the [1-210] direction. As a result, the [10-1-4] direction or the [−1014] direction and the [1-210] direction or the [−12-10] direction can be identified.

Though mark 17 is formed as a plurality of dots at one portion in the present embodiment, marks 17 may be formed in two or more areas, and the mark may be provided as a single dot, or the shape may be other than the dot.

Preferably, mark 17 is formed on a surface opposite to the surface to be used for the semiconductor devices, of nitride semiconductor substrate 10e. Even when mark 17 is formed on the back surface and a non-transmissive metal film or the like is formed, mark 17 formed on the back surface can readily be recognized by a microscope when the main surface is polished, since the nitride semiconductor has light transmitting characteristic.

The method of manufacturing nitride semiconductor substrate 10e in accordance with the present embodiment is basically the same as the method of manufacturing the nitride semiconductor substrate 10a in accordance with Embodiment 1, and it is different in that mark 17 is formed in place of orientation flat 12.

The method of forming mark 17 is not specifically limited and, by way of example, a method of forming a spot by laser irradiation, or a method of scribing a trace by a diamond pen may be used. Thus, mark 17 can easily be formed. Further, mark 17 can be formed with high accuracy.

Though orientation flat 12, notch 15 and mark 17 have been described as indicator portions in Embodiments 1 to 5, the indicator portions of the nitride semiconductor devices in accordance with the present invention are not specifically limited to these. The nitride semiconductor substrate in accordance with the present invention may include a combination of orientation flats, notches and marks.

Embodiment 6

Figure 9:
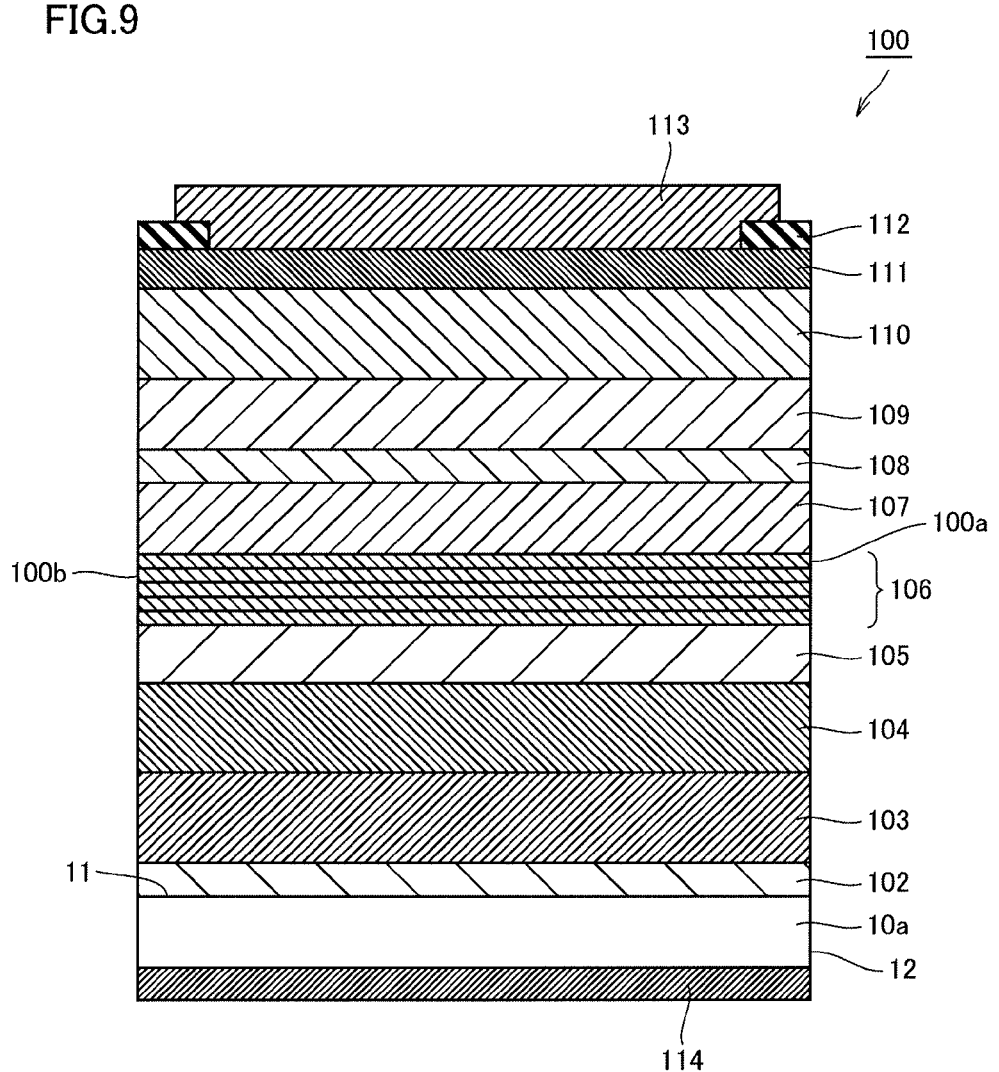
FIG. 9 is a cross-sectional view schematically showing a semiconductor laser in accordance with Embodiment 6 of the present invention.
Figure 10:
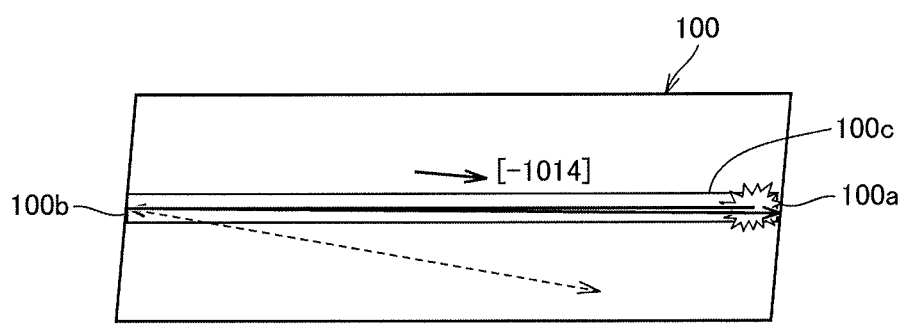
FIG. 10 is a schematic diagram showing a position of a wave-guide when the semiconductor laser in accordance with Embodiment 6 is viewed from above.

Referring to FIGS. 9 and 10, a semiconductor laser (LD, Laser Diode) 100 as an example of the semiconductor device in accordance with the present embodiment will be described. Semiconductor laser 100 in accordance with the present embodiment mainly includes, by way of example, the nitride semiconductor substrate 10a in accordance with Embodiment 1, an n-type buffer layer 102, an n-type cladding layer 103, an n-type guiding layer 104, an undoped guiding layer 105, an active layer 106, an undoped guiding layer 107, a p-type blocking layer 108, a p-type guiding layer 109, a p-type cladding layer 110, a p-type contacting layer 111, an insulating film 112, a p-type electrode 113 and an n-type electrode 114.

N-type buffer layer 102 is formed on main surface 11 of nitride semiconductor substrate 10a. N-type buffer layer 102 is, for example, an n-type GaN having the thickness of 1000 nm. N-type cladding layer 103 is formed on n-type buffer layer 102 and, for example, it is n-type InAlGaN (indium aluminum gallium nitride) having the thickness of 200 nm. N-type guiding layer 104 is formed on n-type cladding layer 103 and, for example, it is n-type GaN having the thickness of 200 nm. Undoped guiding layer 105 is formed on n-type guiding layer 104 and, for example, it is undoped InGaN (aluminum gallium nitride) having the thickness of 65 nm. Active layer 106 is formed on undoped guiding layer 105 and, for example, it is a MQW (multiple-quantum well) with three periods consisting of GaN of 15 nm in thickness and InGaN of 3 nm in thickness. Active layer 16 may be a single layer. Undoped guiding layer 107 is formed on active layer 106 and, for example, it is an undoped InGaN having the thickness of 65 nm. P-type blocking layer 108 is formed on undoped guiding layer 107 and, for example, it is a p-type AlGaN having the thickness of 20 nm. P-type guiding layer 109 is formed on p-type blocking layer 108 and, for example, it is p-type GaN having the thickness of 200 nm. P-type cladding layer 110 is formed on p-type guiding layer 109 and, for example, it is a p-type InAlGaN having the thickness of 400 nm. P-type contacting layer 111 is formed on p-type guiding layer 109 and, for example, it is p-type GaN having the thickness of 50 nm.

Insulating film 112 is formed on p-type contacting layer 111 and, for example, it is $SiO_2$ (silicon dioxide) having a stripe-shaped opening. The opening is along the (−1017) plane, the (10-1-7) plane, or the plane inclined by at least −4° and at most 4° in [1-100] direction from these planes and inclined by at least −0.5° and at most 0.5° in a direction orthogonal to the [1-100] direction. In other words, the opening is formed along the [−1014] direction, the [10-1-4] direction or the direction inclined by at least −4° and at most 4° in [1-100] direction from these directions and inclined by at least −0.5° and at most 0.5° in a direction orthogonal to the [1-100] direction.

P-type electrode 113 is formed on p-type contacting layer 111 and insulating film 112 and, for example, it is formed of Ni (nickel)/Au (gold). N-type electrode 114 is formed on a back surface of nitride semiconductor substrate 10a and, for example, it is formed of Ti (titanium)/Al (aluminum)/Ti/Au.

Figure 11:
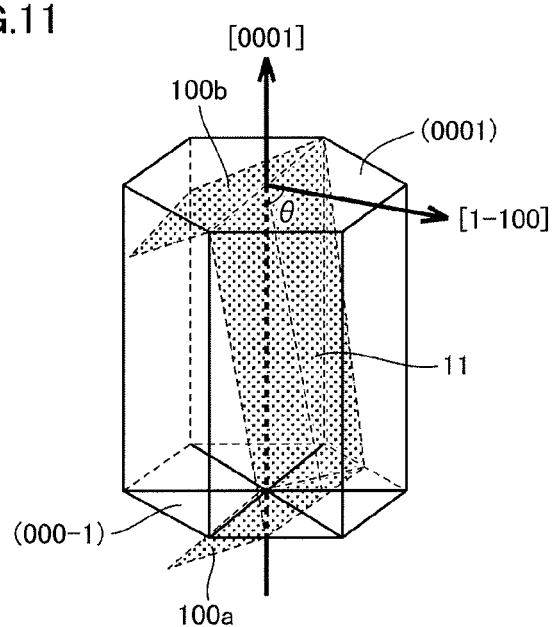
FIG. 11 is a schematic diagram showing the crystal orientation of an end surface of the semiconductor laser and the nitride semiconductor substrate in accordance with Embodiment 6 of the present invention.

Semiconductor laser 100 in accordance with the present embodiment is formed to have a surface substantially parallel to orientation flat 12 as an end surface. Specifically, as shown in FIG. 10, an end surface 100a of semiconductor laser 100 has substantially the same plane orientation as orientation flat 12. End surfaces 100a and 100b of semiconductor laser 100 are used as end surfaces of a laser resonator. As shown in FIG. 11, end surfaces 100a and 100b are the (−1017) plane, the (10-1-7) plane, or the plane inclined by at least −4° and at most 4° in [1-100] direction from these planes and inclined by at least −0.5° and at most 0.5° in a direction orthogonal to the [1-100] direction. In other words, the end surfaces 100a and 100b are substantially orthogonal to the plane inclined by at least 71° and at most 79° in the [1-100] direction from the (0001) plane, or a plane inclined by at least 71° and at most 79° in the [−1100] direction from the (000-1) plane (main surface of semiconductor laser 100, that is, main surface 11 of nitride semiconductor substrate 10). End surfaces 100a and 100b are different from the conventional cleavage planes such as the c-plane, m-plane or a-plane.

Since the opening of insulating film 112 is formed in the direction as described above, the orientation of a waveguide 100c (see FIG. 10) of semiconductor laser 100 in accordance with the present embodiment is the [10-1-4] direction, the [−1014] direction or the direction inclined by at least −4° and at most 4° in [1-100] direction from these directions and inclined by at least −0.5° and at most 0.5° in a direction orthogonal to the [1-100] direction. Specifically, waveguide 100c is formed in a direction substantially at a right angle to the end surfaces 100a and 100b (the (−1017) plane, the (10-1-7) plane or a plane inclined by at least −4° and at most 4° in the [1-100] direction from these planes and inclined by at least −0.5° and at most 0.5° in a direction orthogonal to the [1-100] direction).

Emission wavelength of semiconductor laser 100 as a light emitting device may be set to at least 430 nm and at most 550 nm. The emission wavelength can be adjusted by In composition of active layer 106. In nitride semiconductor substrate 10a in accordance with the present embodiment, In incorporation efficiency during epitaxial growth can be improved, and good light emission characteristics can be attained in the green region of 500 nm to 550 nm.

In the following, a method of manufacturing semiconductor laser 100 in accordance with the present embodiment will be described. First, nitride semiconductor substrate 10a in accordance with Embodiment 1 is prepared.

Next, on main surface 11 of nitride semiconductor substrate 10a, n-type buffer layer 102, n-type cladding layer 103, n-type guiding layer 104, undoped guiding layer 105, active layer 106, undoped guiding layer 107, p-type blocking layer 108, p-type guiding layer 109, p-type cladding layer 110, and p-type contacting layer 111 are formed in this order. Though the method of forming these layers is not specifically limited, vapor phase growth method or liquid phase growth method may be used.

Next, insulating film 112 is formed by photolithography on p-type contact layer 111. Thereafter, p-type electrode 113 and n-type electrode 114 are formed, for example, by vapor deposition.

By the process steps described above, semiconductor laser 100 shown in FIG. 9 can be manufactured.

As described above, semiconductor laser 100 in accordance with the present embodiment uses nitride semiconductor substrate 10a having orientation flat 12 as the (−1017) plane, the (10-1-7) plane or a plane inclined by at least −4° and at most 4° in the [1-100] direction from these planes and inclined by at least −0.5° and at most 0.5° in a direction orthogonal to the [1-100] direction.

Since orientation flat 12 allows identification of the (−1017) plane, the (10-1-7) plane or the plane inclined by at least −4° and at most 4° in the [1-100] direction from these planes and inclined by at least −0.5° and at most 0.5° in a direction orthogonal to the [1-100] direction, semiconductor laser 100 having wave guide 100c formed along the [10-1-4] direction, the [−1014] direction or the direction inclined by at least −4° and at most 4° in [1-100] direction from these directions and inclined by at least −0.5° and at most 0.5° in a direction orthogonal to the [1-100] direction can be realized. As shown in FIG. 10, when light emitted from end surface 100a proceeds to the other end surface 100b and reflected, the number of light reciprocation (number of reciprocation in the resonator in waveguide 100c) is one or more and amplification easily occurs, since waveguide 100c is formed in the [10-1-4] direction, the [−1014] direction or the direction inclined by at least −4° and at most 4° in [1-100] direction from these directions and inclined by at least −0.5° and at most 0.5° in a direction orthogonal to the [1-100] direction in the present embodiment. Thus, performance as semiconductor laser 100 can be maintained. If waveguide 100c is formed in a direction deviated by more than 0.5° from the [10-1-4] direction or the [−1014] direction, the number of light reciprocation becomes smaller than 1 as represented by a dotted line in FIG. 10. Therefore, by identifying the (−1017) plane, the (10-1-7) plane or a plane inclined by at least −4° and at most 4° in the [1-100] direction from these planes and inclined by at least −0.5° and at most 0.5° in a direction orthogonal to the [1-100] direction, laser lasing yield of semiconductor laser 100 can be improved.

Further, the inventors have found that in semiconductor laser 100 having the main surface inclined by at least 71° and at most 79° in the [1-100] direction from the (0001) plane or the main surface inclined by at least 71° and at most 79° in the [−1100] direction from the (000-1) plane, by forming waveguide 100c along the [10-1-4] direction, the [−1014] direction or the direction inclined by at least −4° and at most 4° in the [1-100] direction from these directions and inclined by at least −0.5° and at most 0.5° in a direction orthogonal to the [1-100] direction, laser lasing yield of semiconductor laser 100 can be improved. Thus, improved characteristics can be attained by semiconductor laser 100 in accordance with the present embodiment.

Though semiconductor laser 100 including nitride semiconductor substrate 10a in accordance with Embodiment 1 has been described as an example, the semiconductor device in accordance with the present invention is not limited to the semiconductor laser, and the present invention is applicable, for example, to an LED (Light Emitting Diode), an MOSFET (Metal Oxide Semiconductor Field Effect Transistor), a JFET (Junction Field-Effect Transistor), a pn diode, a Schottky barrier diode (SBD), or an IGBT (Insulated Gate Bipolar Transistor).

Example 1

In the present example, that the (−1017) plane, the (10-1-7) plane, or the plane inclined by at least −4° and at most 4° in [1-100] direction from these planes and inclined by at least −0.5° and at most 0.5° in a direction orthogonal to the [1-100] direction has a characteristic that tends to be cleaved easily was confirmed.

First, from a (0001) GaN ingot (ingot of GaN crystal having (0001) plane as the main surface) formed thick by HVPE method, a (20-21) plane GaN substrate having the diameter of 2 inches and thickness of 370 μm was cut out at an angle of 75 degrees in the [1-100] direction. The main surface of GaN substrate was mirror-finished, and the back surface was satin-finished by grinding. Surface roughness of the main surface of GaN substrate was 1.5 nm by Ra standard, and surface roughness of the back surface was 3 μm by Ra standard.

On the satin-finished back surface, a marking-off line is scribed by a diamond pen in a direction vertical to the direction of [0001] direction projected to the main surface of GaN substrate, and then the GaN substrate was pressed and split to the (−1017) plane and the (10-1-7) plane. To observe the verticality of resulting split surface (end surface), the GaN substrate was inspected from the a-plane direction using a scanning electron microscope.

Figure 12:
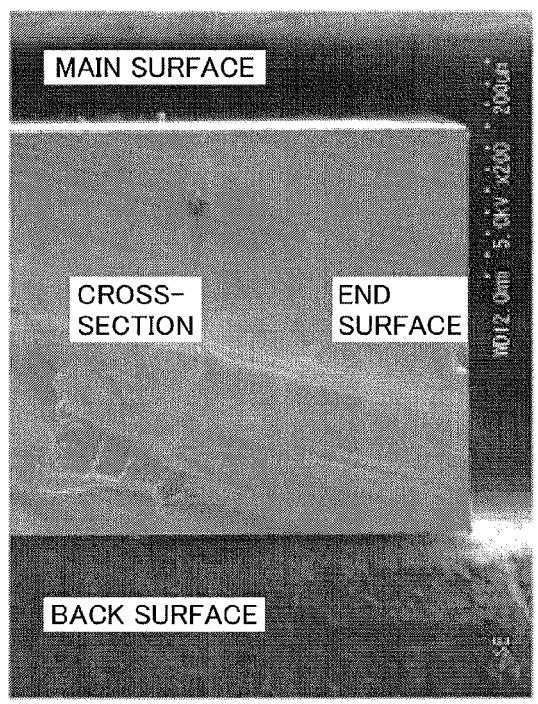
FIG. 12 shows an image of scanning electron microscope of the resonator end surface in accordance with Example 1.

FIG. 12 is an image of scanning electron microscope showing the split surface from the a-plane direction, and the end surface on the right side is the split surface. As shown in FIG. 12, the (−1017) plane or the (10-1-7) plane as the split surface has the easy-to-cleave characteristic, and is flat and vertical to the (20-21) plane.

In the present example, flatness and verticality of the (−1017) plane or the (10-1-7) plane to the (20-21) plane were inspected. Flatness and verticality of the (−1017) plane or the (10-1-7) plane to the (−202-1) plane can also be considered in the similar manner, though there is a difference of Ga-rich plane and N-rich plane. Therefore, it can be understood that the (−1017) plane or the (10-1-7) plane as the cleavage surface has the easy-to-cleave characteristic, and is flat and vertical to the (−202-1) plane.

Similar results could be observed in the crystal formed by the flux method. Further, comparable results as described above could be observed when a single GaN crystal was grown by HVPE method by joining base substrates. Similar results could be observed on a GaN substrate having the diameter of 4 inches.

Example 2

In this example, the effect attained by the fact that the main surface of nitride semiconductor substrate is a plane inclined by at least 71° and at most 79° in the [1-100] direction from the (0001) plane, or a plane inclined by at least 71° and at most 79° in the [−1100] direction from the (000-1) plane was examined.

Specifically, in Example 1, it was found that in the GaN substrate having the semipolar (20-21) plane as the main surface, the (−1017) plane and the (10-1-7) plane as split surfaces obtained by forming a mark-off line vertical to the direction of [0001] direction projected to the main surface of GaN substrate and pressing had the flatness and verticality to the main surface of the GaN substrate. Therefore, in order to examine the usability of the main surface as a laser resonator, the semiconductor laser shown in FIG. 9 was formed by metal organic chemical vapor deposition. Trimethyl gallium (TMGa), trimethyl ammonium (TMAl), trimethyl indium (TMIn), ammonia (NH3) and silane (SiH$_4$) were used as raw materials.

From a (0001) GaN ingot grown thick by HVPE method, GaN substrates were cut out using a wafer slicer at the angle θ (see FIG. 2) in the range of 68° to 82° in the [1-100] direction, and thus, GaN substrates having desired off-angles with the angle of inclination θ from the [0001] direction to the [1-100] direction being in the range of 68 to 82° were fabricated. By way of example, when cut out at an angle θ of 75°, a GaN substrate having the (20-21) plane as the main surface was obtained, which is represented by main surface 11 in the hexagonal crystal lattice shown in FIG. 2. The cut-out substrate was subjected to processing of outer circumference, and shaped to a circle of 50 mm in diameter and 370 μm in thickness.

Further, the GaN substrate was cut to form an orientation flat of (−1017) plane. The length of orientation flat was 16 mm. The (−1017) plane is represented by orientation flat 12 in the hexagonal crystal lattice shown in FIG. 2. The main surface of GaN substrate with the orientation flat formed has its main surface mirror-finished, and the back surface ground to satin-finish. Damaged layers damaged during processing were removed from both surfaces by wet etching and/or dry etching.

The GaN substrate as the nitride semiconductor substrate was placed on a susceptor in a reaction chamber, and epitaxial layers were grown in accordance with the following process steps. First, as n-type buffer layer 102, n-type GaN of 1000 nm in thickness was grown. Thereafter, as n-type cladding layer 103, n-type InAlGaN cladding layer of 1200 nm in thickness was grown. Next, an n-type GaN guiding layer of 200 nm in thickness as n-type guiding layer 104, and an undoped InGaN guiding layer of 65 nm in thickness as undoped guiding layer 105 were grown. Thereafter, as active layer 106, an MQW with three periods consisting of GaN of 15 nm in thickness/InGaN of 3 nm in thickness was grown. Thereafter, undoped InGaN guiding layer of 65 nm in thickness as undoped guiding layer 107, a p-type AlGaN blocking layer of 20 nm in thickness as p-type blocking layer 108, and p-type GaN guiding layer of 200 nm in thickness as p-type guiding layer 109 were grown. Next, as p-type cladding layer 110, p-type InAlGaN cladding layer of 400 nm in thickness was formed. Finally, as p-type contact layer 111, p-type GaN contact layer of 50 nm in thickness was grown.

Insulating film 112 of SiO$_2$ was formed on p-type contact layer 111 and, thereafter, a window as a stripe having the width of 10 μm was formed by photolithography and wet etching. Here, since the [−1014] direction can be identified in the epitaxial layers using orientation flat 12, the direction of laser stripe was set to a direction inclined by at least −0.5° and at most 0.5° from the [−1014] direction. After forming the stripe window, p-type electrode 113 of Ni/Au and a pad electrode of Ti/Al were vapor-deposited. Thereafter, the back surface of GaN substrate was polished to the thickness of 100 μm or thinner to make cleavage easier, and thus, a substrate product having mirror-finished back surface was fabricated. On the back surface (polished surface) of GaN substrate, n-type electrode 114 of Ti/Al/Ti/Au was formed by vapor deposition.

For the fabrication of resonator mirror utilizing the laser stripe, a laser scriber using YAG laser having the wavelength of 355 nm was used. When broken using a laser scriber, yield of lasing chips can be improved than when a diamond scriber is used. As to the conditions for forming the scribe groove, the laser beam output was set to 100 mW and the scanning speed was set to 5 mm/s. The scribe groove thus formed had the length of 30 μm, width of 10 μm, and depth of 40 μm. By directly irradiating the surface of epitaxial layer with the laser beam through the opening of insulating film on the GaN substrate with the pitch of 800 μm, the scribe groove was formed. The length of the resonator was set to 600 μm.

Using a blade, the resonator mirror was formed by splitting. By pressing the back side of GaN substrate and breaking, a laser bar was formed. More specifically, the end surfaces 100a and 100b for the laser resonator were, as is main surface 11, (−1017) plane and (10-1-7) plane as shown in FIG. 11, and these are different from the conventional cleavage planes such as the c-plane, m-plane or a-plane.

The split surface formed by breaking was observed by scanning electron microscope, and notable unevenness was not observed. Thus, it is assumed that flatness of the split surface (size of unevenness) is at most 20 nm. Further, verticality of the split surface to the sample surface was within the range of ±5°.

The end surface of laser bar was coated with a dielectric multi-layered film, by vacuum deposition. The dielectric multi-layered film was formed by alternately stacking $SiO_2$ and $TiO_2$ (titanium dioxide). The film thickness of each layer was adjusted to be within the range of 50 nm to 100 nm, so that the central wavelength of reflectance comes within the range of 500 nm to 530 nm. One reflection surface was designed to have 10 periods and the designed reflectance of about 95%, and the other reflection surface was designed to have 6 periods and the designed reflectance of about 80%.

Figure 13:
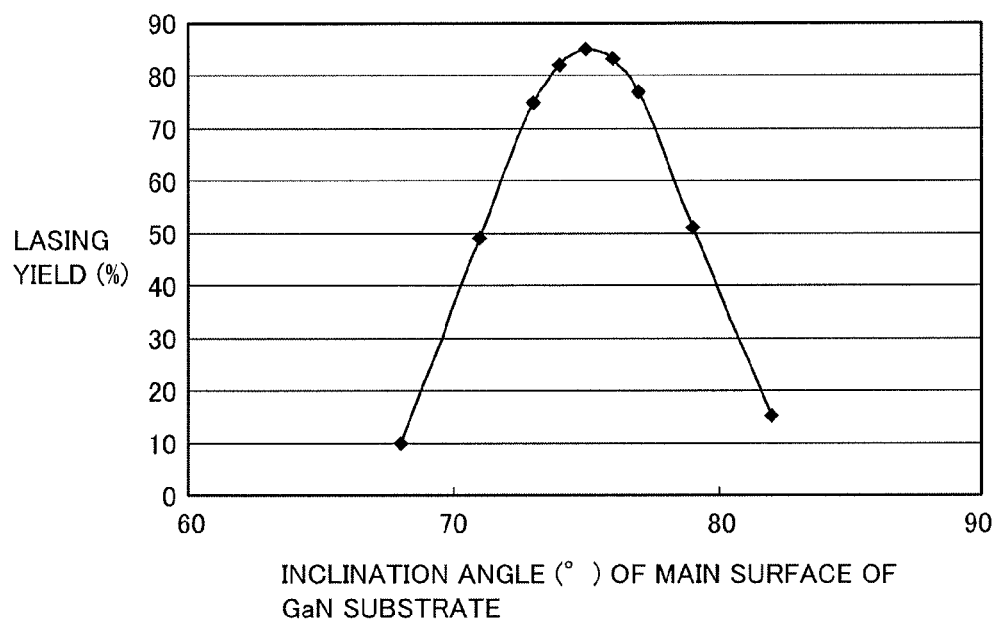
FIG. 13 shows a relation between the angle of inclination in the [1-100] direction from the (0001) plane of the GaN substrate and the lasing yield in Example 2.

The relation between the angle of inclination θ from the [0001] direction to the [1-100] direction of the GaN substrate and the lasing yield of the semiconductor laser formed in the above-described manner was studied. The results are as shown in FIG. 13 and Table 1. In the present embodiment, the lasing yield was defined as (number of chips that oscillated)/(number of chips that were measured). FIG. 13 plots the results for the GaN substrate having the stacking fault density of $1 \times 10^4$ ($cm^{-1}$) or smaller and the semiconductor laser having the laser stripe in the [-1014] direction.

TABLE 1

| Angle of inclination θ (°) | Yield (%) |
|---|---|
| 68 | 10 |
| 71 | 50 |
| 73 | 75 |
| 74 | 82 |
| 75 | 85 |
| 76 | 84 |
| 77 | 77 |
| 79 | 51 |
| 82 | 15 |

From FIG. 13 and Table 1, it was found that when the angle θ (off angle) is 68° or smaller or if the angle is 82° or larger, lasing yield was very low. From observation of the end surface state by an optical microscope, it was found that the (1-100) plane or equivalent plane appeared in most of the chips when the angle was 68° or smaller or 82° or larger, and verticality was not attained. With the off angle in the range of 71° to 79°, verticality was improved and the lasing yield was increased to 50% or higher. Particularly, with the off angle in the range of 73° to 77°, the lasing yield was improved to 75% or higher, with the off angle in the range of 74° to 76°, the lasing angle was as high as 82% or higher, and with off angle of 75°, the lasing yield was increased to 85% or higher.

From these observations, it was confirmed that the lasing yield could be improved if the range of off angle from the (0001) plane of the main surface of GaN substrate to the [1-100] direction is at least 71° and at most 79°, preferably at least 73° and at most 77°, and more preferably is or close to 75°.

Further, while the angle of inclination of the main surface from the (0001) plane to the [1-100] direction has been studied in the present embodiment, the inclination from the (000-1) plane to the [-1100] direction can also be considered similarly, though there is a difference of Ga-rich plane and the N-rich plane. Therefore, it can be understood that the lasing yield could be improved if the range of off angle from the (000-1) plane of the main surface of GaN substrate to the [-1100] direction is at least 71° and at most 79°, preferably at least 73° and at most 77°, and more preferably is or close to 75°.

Further, in the present embodiment, it was confirmed that the lasing yield could be improved if the plane orientation of the main surface of GaN substrate was inclined by at least −4° and at most 4° from the (20-21) plane in the [1-100] direction, when the orientation flat was (−1017) plane. From the foregoing, it was estimated that similar lasing yield could be attained if the orientation flat was inclined by at least −4° and at most 4° from the (−1017) plane in the [1-100] direction, with the main surface of GaN substrate being the (20-21) plane or the (−202-1) plane. Therefore, if the indicator portion indicates the (−1017) plane, the (10-1-7) plane or a plane inclined by at least −4° and at most 4° from these planes in the [1-100] direction, the lasing yield can be improved.

Example 3

In the present example, the effect of providing the indicator portion indicating the (−1017) plane, the (10-1-7) plane or a plane inclined by at least −0.5° and at most −0.5° from these planes in the [1-100] direction was studied.

Specifically, in Example 1, it was found that in the GaN substrate having the semipolar (20-21) plane as the main surface, the (−1017) plane and the (10-1-7) plane as the split surfaces obtained by forming mark-off lines in the direction of [0001] direction projected on the main surface of GaN substrate and pressing the same had flatness and verticality to the main surface of the GaN substrate. In order to examine the usefulness of the split surfaces as the laser resonator, a plurality of GaN substrates having the (20-21) plane as the main surface were prepared as in Example 2. Orientation flats as the (−1017) plane, or planes having prescribed inclination angles in the [1-210] direction from this plane were formed in the GaN substrates.

Figure 14:
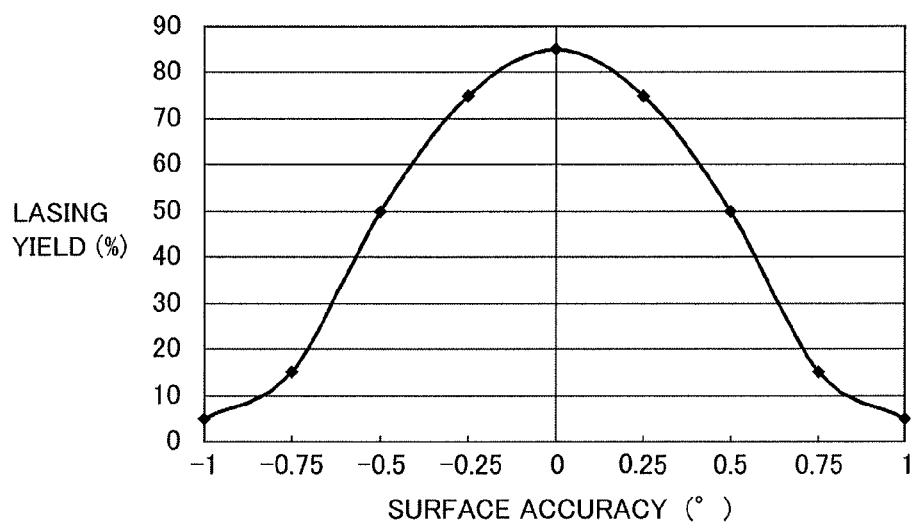
FIG. 14 shows a relation between the angle of deviation (surface accuracy) of the orientation flat of the GaN substrate in a direction orthogonal to the [1-100] direction from the (-1017) plane and the lasing yield, in Example 3.

As in Example 2, semiconductor lasers were formed, and yield of semiconductor lasers was measured. The results are as shown in FIG. 14 and Table 2. In FIG. 14 and Table 2, the abscissa represents, as surface accuracy, the angle of deviation from the (−1017) plane.

TABLE 2

| Surface accuracy (°) | Yield (%) |
|---|---|
| −1 | 5 |
| −0.75 | 15 |
| −0.5 | 50 |
| −0.25 | 75 |
| 0 | 85 |
| 0.25 | 75 |
| 0.5 | 50 |
| 0.75 | 15 |
| 1 | 5 |

As shown in FIG. 14 and Table 2, when the orientation flat was deviated exceeding the range of −0.75° to 0.75° from the (−1017) plane, the lasing yield was very low. On the other hand, when the orientation flat was inclined by at least −0.5° and at most 0.5° in the direction orthogonal to the [1-100] direction from the (−1017) plane, the lasing yield was improved to 50% or higher. Particularly, if the orientation flat was inclined by at least −0.25° and at most 0.25° in the direction orthogonal to the [1-100] direction from the (−1017) plane, the lasing yield was much improved to 75% or higher, and if the orientation flat was the (−1017) plane, the lasing yield could be improved to as high as 85%.

From these observations, it was confirmed that by providing the indicator portion indicating the (−1017) plane, the (10-1-7) plane or a plane inclined by at least −0.5° and at most 0.5° in a direction orthogonal to the [1-100] direction, the lasing yield could be improved.

Further, it was found that the direction orthogonal to the [1-100] direction of the present example and the [1-100] direction of Example 2 have different light confinement effect and, therefore, the tolerable range of inclination angle was different.

Though the embodiments and examples of the present invention have been described, appropriate combinations of features of each of the embodiments and examples are naturally expected.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A nitride semiconductor substrate, comprising:
    a main surface; and
    an indicator portion; wherein
    said main surface is a plane inclined by at least 71° and at most 79° in a [1-100] direction from a (0001) plane, or a plane inclined by at least 71° and at most 79° in a [−1100] direction from a (000-1) plane; and
    said indicator portion indicates a (−1017) plane, a (10-1-7) plane, or a plane inclined by at least −4° and at most 4° in the [1-100] direction from these planes and inclined by at least −0.5° and at most 0.5° in a direction orthogonal to the [1-100] direction.

2. The nitride semiconductor substrate according to claim 1, wherein
    said indicator portion is an orientation flat; and
    said orientation flat is the (−1017) plane, the (10-1-7) plane, or a plane inclined by at least −4° and at most 4° in the [1-100] direction from these planes and inclined by at least −0.5° and at most 0.5° in a direction orthogonal to the [1-100] direction.

3. The nitride semiconductor device according to claim 2, further comprising
    a second orientation flat as a (11-20) plane, or a plane inclined by at least −4° and at most 4° in the [1-100] direction from this plane and inclined by at least −0.5° and at most 0.5° in a direction orthogonal to the [1-100] direction.

4. The nitride semiconductor substrate according to claim 1, wherein
    said main surface is a (20-21) plane or a (−202-1) plane; and
    said indicator portion indicates the (−1017) plane or the (10-1-7) plane.

* * * * *